Figure 1:
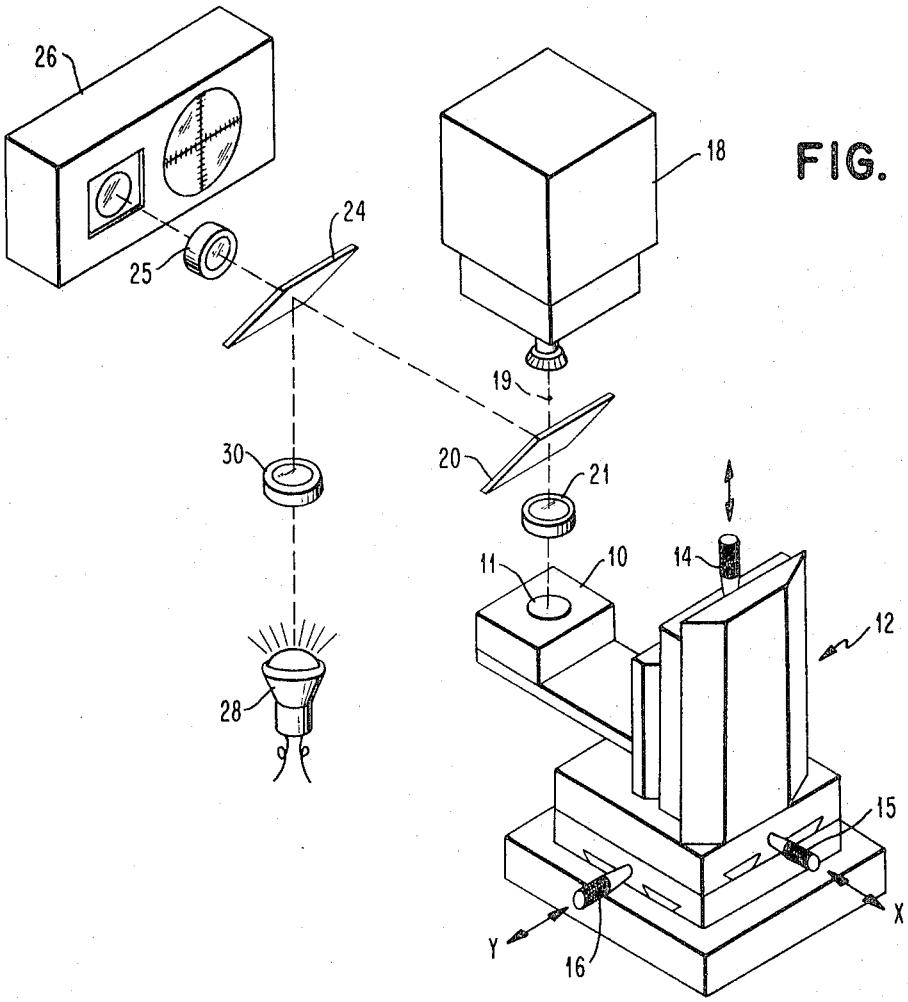
Figure 2:
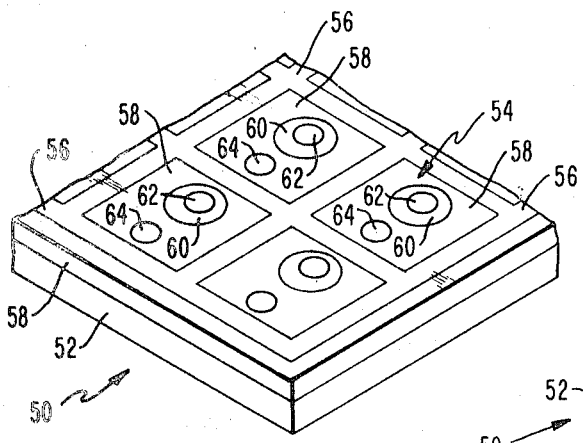
Figure 3:
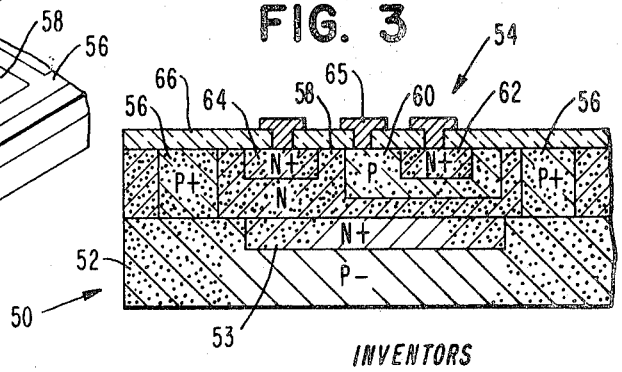

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED MARCH 28, 1972

896 O.G. 1208

T896,048

METHOD FOR MAKING SEMICONDUCTOR JUNCTION DEVICES

John M. Fairfield, Wappingers Falls, and Madhukar Joshi and Guenter H. Schwuttke, Poughkeepsie, N.Y., assignors to International Business Machines Corporation, Armonk, N.Y.

Continuation of application Ser. No. 704,058, Feb. 8, 1968. This application Aug. 20, 1970, Ser. No. 65,666

Int. Cl. B01j *17/00*

U.S. Cl. 148—188

1 Sheet Drawing. 16 Pages Specification

In the method for diffusing an impurity into a semiconductor substrate, a coating which includes the impurity to be diffused is applied to the surface of the substrate and a pulsed laser beam is directed to one or more localized areas of the coated surface of the substrate. The duration and relative location of the beam and substrate is controlled to achieve the desired diffused region configuration.

March 28, 1972 J. M. FAIRFIELD ET AL T896,048

METHOD FOR MAKING SEMICONDUCTOR JUNCTION DEVICES

Original Filed Feb. 8, 1968

INVENTORS

JOHN M. FAIRFIELD
MADHUKAR L. JOSHI
GUENTER H. SCHWUTTKE

BY Wolmar J. Stoffel
ATTORNEY